US012767526B2

(12) United States Patent
Sinclair et al.

(10) Patent No.: US 12,767,526 B2
(45) Date of Patent: Oct. 20, 2026

(54) CHIP ASSEMBLY AND METHOD OF MAKING A CHIP ASSEMBLY

(71) Applicant: NPL MANAGEMENT LIMITED, Teddington (GB)

(72) Inventors: Alastair Sinclair, Teddington (GB); Guido Wilpers, Teddington (GB); Kaushal Choonee, Teddington (GB); Michael Peter Larsson, London (GB)

(73) Assignee: NPL MANAGEMENT LIMITED, Teddington (GB)

( * ) Notice: Subject to any disclaimer, the term of this patent is extended or adjusted under 35 U.S.C. 154(b) by 624 days.

(21) Appl. No.: 18/034,535

(22) PCT Filed: Oct. 29, 2021

(86) PCT No.: PCT/GB2021/052809
§ 371 (c)(1),
(2) Date: Apr. 28, 2023

(87) PCT Pub. No.: WO2022/090729
PCT Pub. Date: May 5, 2022

(65) Prior Publication Data
US 2023/0400788 A1 Dec. 14, 2023

(30) Foreign Application Priority Data
Oct. 30, 2020 (GB) ..................................... 2017243

(51) Int. Cl.
*H10W 46/00* (2026.01)
*B81B 7/00* (2006.01)
(Continued)

(52) U.S. Cl.
CPC ........ *B81C 1/00111* (2013.01); *B81B 7/0009* (2013.01); *B81B 7/0074* (2013.01);
(Continued)

(58) Field of Classification Search
None
See application file for complete search history.

(56) References Cited

U.S. PATENT DOCUMENTS 4,896,936 A 1/1990 Stanley
5,432,878 A 7/1995 Smous
(Continued)

FOREIGN PATENT DOCUMENTS

GB 2328035 A 2/1999
JP 2004310066 A 11/2004

OTHER PUBLICATIONS

Wilpers et al, "A monolithic array of three-dimensional ion traps fabricated with conventional semiconductor technology," Nature Nanotechnology, Jul. 22, 2012, pp. 572-576, vol. 7, No. 9.
(Continued)

*Primary Examiner* — Michelle Mandala
(74) *Attorney, Agent, or Firm* — Dickinson Wright PLLC

(57) ABSTRACT

Alignment features for an optical fibre assembly are formed directly into an ion trap chip to align an optical module with respect to the ion trap chip. This is achieved using micro-fabrication techniques to etch alignment elements into the surface of the ion trap chip, advantageously carried out with lithographic precision achieving the alignment accuracy required of the optical beam geometries for the application, with an alignment accuracy of a few micrometres. The alignment elements are advantageously etched along defined crystal planes of the silicon substrate of the chip. An external microstructure can be micromachined with lithographic precision to contain locating features that will fit, or "plug", into the recesses of the chip, for instance ion microtrap chip.

20 Claims, 14 Drawing Sheets

(51) Int. Cl.
*B81C 1/00* (2006.01)
*H10W 70/65* (2026.01)

(52) U.S. Cl.
CPC ......... *B81C 1/00523* (2013.01); *H10W 46/00* (2026.01); *H10W 70/65* (2026.01)

(56) References Cited

U.S. PATENT DOCUMENTS

| | | | | |
|---|---|---|---|---|
| 6,255,724 | B1 | 7/2001 | Ambrosy et al. | |
| 11,562,984 | B1 * | 1/2023 | Brewer | H01L 24/13 |
| 2002/0084565 | A1 | 7/2002 | Dautartas et al. | |
| 2004/0190814 | A1 * | 9/2004 | Suzuki | B82Y 20/00<br>385/14 |
| 2004/0212802 | A1 | 10/2004 | Case et al. | |
| 2020/0064263 | A1 | 2/2020 | Jungwirth et al. | |

OTHER PUBLICATIONS

Mehta et al. “Integrated optical multi-ion quantum logic”, Nature, Oct. 21, 2020, pp. 1-12, vol. 586, No. 7830.
Niffenegger et al., “Integrated multi-wavelength control of an ion qubit,” Oct. 22, 2020, pp. 1-25, vol. 586.
Mehta et al., “Integrated optical addressing of an ion qubit,” Nature Nanotechnology, Dec. 2016, pp. 1-7, vol. 11.
“Mass Spectrometry for Lipidomics” by Xianlin Han, Lipidomics: Comprehensive Mass Spectrometry of Lipids, First Edition, Published 2016 by John Wiley & Sons, Inc. (4 pages).

* cited by examiner

CHIP ASSEMBLY AND METHOD OF MAKING A CHIP ASSEMBLY

CROSS-REFERENCE TO RELATED APPLICATION(S)

The present application is a U.S. national phase application of International Patent Application No. PCT/GB2021/052809, filed on Oct. 29, 2021, which claims priority to Great Britain Patent Application No. 2017243.3 filed on Oct. 30, 2020, the disclosures of which are hereby incorporated by reference in their entireties.

TECHNICAL FIELD

The present invention relates to an ion microtrap chip assembly and to a method of making an ion microtrap chip assembly, in the preferred embodiments to an optical ion microtrap chip assembly.

BACKGROUND OF THE INVENTION

Ion microtraps are of significant interest for their applicability to quantum technologies such as information processing and metrology. They are expected to be a key component for high-performance quantum computers of the future. These computers, which will contain many quantum bits (or "qubits"), will be able to solve problems that are intractable today.

More specifically, micro-fabricated ion traps (microtraps) offer a method of trapping single ions or strings of ions to create devices for quantum computing, sensing, precision metrology, scientific investigations, quantum communications and networking. As these traps are based on atoms, they have advantages over solid state circuit designs in that reliable and identical traps can potentially be manufactured, enabling scaling up for use in real systems.

Several types of microtraps are currently known and these are usually classified by their electrode geometry as 2D and 3D traps. The performance of microtraps in general increases with the dimensional aspect. However, due to restrictions in availability, many researchers work with 2D traps. Only the 3D trap geometry has the necessary performance in terms of superior heating rate and lower errors suitable for scaling up to industrial systems. In particular, the applicant believes 3D electrode geometry can offer superior operating characteristics and can achieve low noise (motional decoherence) operation at room temperature, beyond that achieved by other devices at room temperature. In quantum gates lower errors are expected from the low measured heating rate.

Testing and characterisation of such ion traps is performed under ultra-high-vacuum (UHV) conditions using apparatus that provides a combination of good optical access and multiple electrical feedthroughs for DC signals and high voltage RF. Most known approaches use standard and usually bulky UHV feedthroughs requiring considerable in-vacuum cabling and electronic filtering to be close to the trap electrodes. A widely used example adds a custom-made socket device enabling the use of ion traps packaged in pin grid array (PGA) carriers. This facilitates quick replacement of chips inside the vacuum.

US-2004/0212802, GB-2,328,035 and U.S. Pat. No. 4,896,936 disclosed assemblies that are not ion microtraps and that have characteristics consistent with the prior art discussed below in connection with FIGS. 1 and 2.

U.S. Pat. No. 6,255,724 discloses a microstructure assembly that relies on deformation of one alignment component relative to another. The document does not relate to ion microtrap assemblies and would not be suitable for such precision assemblies.

U.S. Pat. No. 5,432,878 discloses an assembly in which an optoelectronic device is mounted on a carrier made of compliant material and which is designed to slide relative to a substrate for positioning purposes. The document does not relate to ion microtrap assemblies and would not be suitable for such precision assemblies.

Karan K. Mehta et al in "Integrated optical addressing of an ion qubit", NATURE NANOTECHNOLOGY, vol. 11, December 2016, discusses that individual trapped ions show great promise for quantum computing but that the lack of a scalable optical interface to manipulate and measure the quantum states of the ions has been a major limitation to the development of a large-scale system. Karan K. Mehta et al suggest an approach to solve this problem that utilizes nanophotonic single-mode waveguides and grating couplers integrated within the trap chip.

R. J. Niffenegger et al in "Integrated multi-wavelength control of an ion qubit", NATURE, vol. 586, pp. 538-542, 22 Oct. 2020 disclose that trapped atomic ions form the basis of high-fidelity quantum information processors and high-accuracy optical clocks; but that current implementations rely on free-space optics for ion control, which limits their portability and scalability. They suggest as the solution to this problem the monolithic integration of control technologies for atomic systems as a promising route to the development of quantum computers and portable quantum sensors.

Karan K. Mehta et al in "Integrated optical multi-ion quantum logic" NATURE, Vol. 586, pp. 533-537, 22 Oct. 2020, disclose that practical and useful quantum information processing requires substantial improvements with respect to current systems, both in the error rates of basic operations and in scale. The fundamental qualities of individual trapped-ion qubits are promising for long-term systems, but the optics involved in their precise control are a barrier to scaling. They propose that planar-fabricated optics integrated within ion-trap devices can make such systems simultaneously more robust and parallelizable, particularly by the use of scalable optics co-fabricated with a surface-electrode ion trap to achieve high-fidelity multi-ion quantum logic gates, which are often the limiting elements in building up the precise, large-scale entanglement that is essential to quantum computation.

The solutions proposed in the art to the problem of fabrication of ion microtrap designs focus on the production of a single, monolithic structure to try to assure alignment of the optical and electrical components of the assembly. However, the inventors of the present application have found that this approach can place a limit on the optimisation of the individual components in preference to alignment. As a consequence, the approaches in the art can result in less than optimal assemblies.

All these approaches present limitations to properties desirable for ion-trap characterisation and operation, in particular: low-loss transmission of high-voltage RF signals; transmission of low-noise DC voltages; fast DC switching speeds; efficient filtering of RF pick-up; flexibility of the electronic setup; scalability; reliability, and so on. An example for the need for flexibility is the difference between the electronic filtering for the measurement of anomalous heating rates and for the fast and controlled shuttling of ions.

By coupling ion traps to optical cavities, it is possible to construct advanced quantum information systems, such as a quantum repeater node a modular quantum computer distributed across a photonic network.

In order to seek to meet challenge of scalability, one solution is to use microelectromechanical systems (MEMS) fabrication technology to miniaturize an ion-cavity assembly. A MEMS-based ion trap can also be readily integrated into other types of MEMS devices. MEMS techniques can also reduce the footprint of the optical cavity assembly, particularly for the mirror actuators. However, when commercial nano-scale positioning stages are employed, they place significant space demands on the UHV (ultra-high vacuum) assembly.

SUMMARY OF THE PRESENT INVENTION

The present invention seeks to provide an improved chip assembly and method of making a chip assembly, particularly for ion trap applications.

According to an aspect of the present invention, there is provided a method of fabricating an ion microtrap chip assembly, the assembly including an ion microtrap chip having a chip substrate, and at least one micro-structure disposed on the chip substrate; method including the steps of forming directly into the chip substrate one or more first alignment elements, forming in the at least one micro-structure one or more second alignment elements; wherein the first and second alignment elements are recesses or protrusions and locating the at least one microstructure on the chip substrate with the at least one second alignment element keyed to the at least one first alignment element; and affixing the micro-structure in position relative to the chip structure, whereby the first and second alignment elements key to fix the micro-structure to the chip substrate in all directions in a plane of the micro-structure.

The method taught in the present application has not previously been considered in the fabrication of an ion microtrap chip assembly. It enables the optimisation of the individual components of the assembly, such as the ion microtrap and the optical assembly coupled thereto. Such optimisation is not considered possible with a monolithic structure.

The or each recess may be etched into the chip substrate and/or the micro-structure.

Advantageously, the or at least one of the protrusions is located directly on the chip substrate and/or the micro-structure. This provides a direct alignment of the micro-structure to the chip substrate and therefore to the ion trap, and a precision assembly.

In other embodiments, a spacer element may be located in the or a first alignment element and the micro-structure is disposed on the spacer element. For this purpose, the method may include forming at least one alignment element in the chip substrate and forming at least two spacer alignment elements in the spacer element, wherein at least one spacer alignment element is disposed in engagement with the at least one alignment element in the chip structure and another of the spacer alignment elements is disposed in engagement with at least one alignment element of the chip carrier.

Preferably, the alignment elements are made of rigid material. Most preferably, the chip substrate and the micro-structure are made of rigid material. This enables very accurate alignment to be achieved, not possible in systems which provide some adjustability to the elements of the assembly.

Preferably, the chip substrate is crystalline. Advantageously, the or at least one of the alignment element is formed along a crystal plane of the chip substrate. Use of the crystallinity of the chip substrate can provide very accurate alignment features with fabrication repeatability.

The chip substrate may be made of silicon.

In embodiments, the or each alignment element is lithographically formed.

Preferably, the assembly is a 3D ion microtrap chip assembly.

Advantageously, the or at least one micro-structure is an optical module or an atomic shield.

The method may include forming a plurality of recesses for holding a plurality of protrusions, said micro-structure being an optical module containing an array of waveguides and micro-lenses.

According to another aspect of the present invention, there is provided an ion microtrap chip assembly comprising a ion microtrap chip with a chip substrate, one or more first alignment elements formed directly on the chip substrate; one or more micro-structures having one or more second alignment elements formed directly on the micro-structure; wherein the first and second alignment elements are recesses or protrusions; the at least one micro-structure being disposed on the chip substrate with the at least one first alignment element keyed to the at least one second alignment element, whereby the first and second alignment elements key to fix the micro-structure to the chip substrate in all directions in a plane of the chip assembly and thereby to affix in alignment the micro-structure to the ion microtrap.

Advantageously, the or each recess is an etched formation in the chip substrate and/or micro-structure.

Preferably, the alignment elements are made of rigid material. Most preferably, the chip substrate and the micro-structure are made of rigid material.

In some embodiments, the or each protrusion is formed directly on the chip substrate and/or micro-structure.

In other embodiments, the assembly may include at least one spacer element located on the chip substrate, the micro-structure being affixed to the at least one spacer element. For this purpose, the assembly may include at least one alignment element in the chip substrate and at least two spacer alignment elements in the spacer, wherein at least one spacer alignment element is disposed in engagement with the at least one alignment element in the chip structure and another of the spacer alignment elements is disposed in engagement with the or at least one second alignment element of the micro-structure.

Preferably, the chip substrate is crystalline. Advantageously, the or at least one of the alignment elements is disposed along a crystal plane of the chip substrate.

Preferably, the chip is a 3D ion microtrap chip.

In the preferred embodiments, the or at least one micro-structure is an optical module or an atomic shield.

In a practical embodiment, the chip assembly includes a plurality of first alignment elements holding a plurality of second alignment elements formed on an optical module containing an array of waveguides and micro-lenses, the optical module being the micro-structure.

Other advantages, features and aspects of the teachings herein will become apparent to the skilled person from the following description of preferred embodiments.

BRIEF DESCRIPTION OF THE DRAWINGS

Embodiments of the present invention are described below, by way of example only, with reference to the accompanying drawings, in which.

DESCRIPTION OF THE PREFERRED EMBODIMENTS

Figure 1:
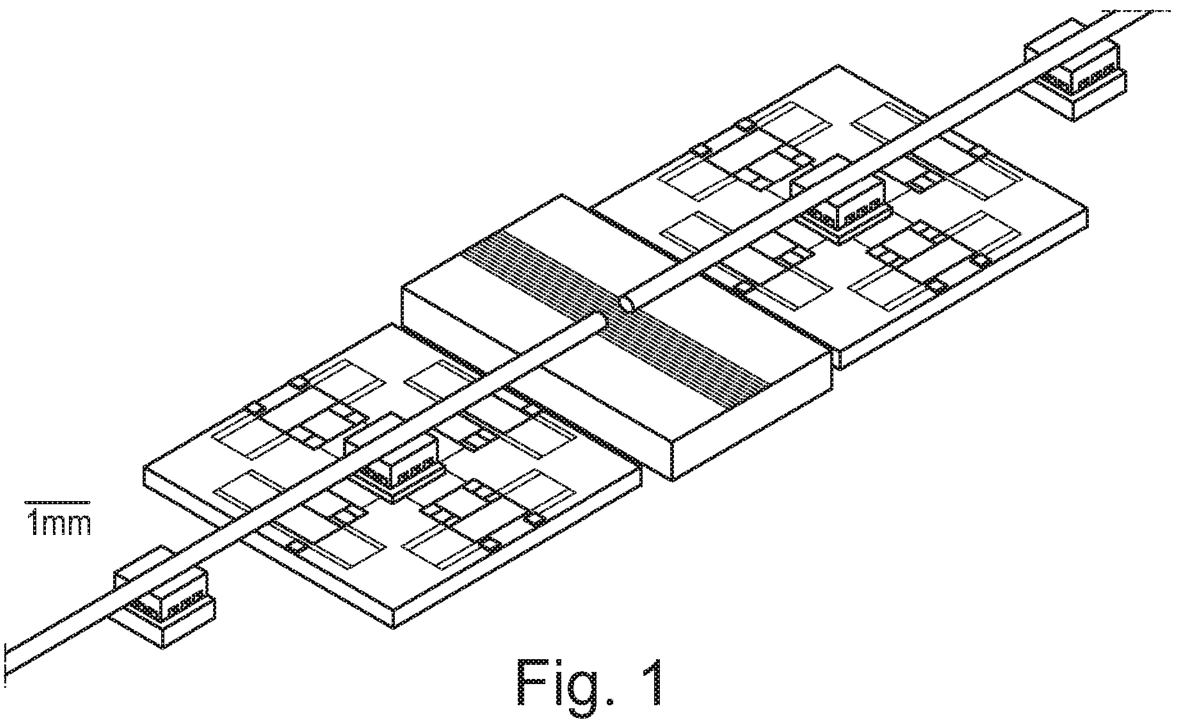
FIG. 1 is a perspective view of a prior proposed assembly of a MEMS based fibre cavity integrated with a surface ion trap.
Figure 2:
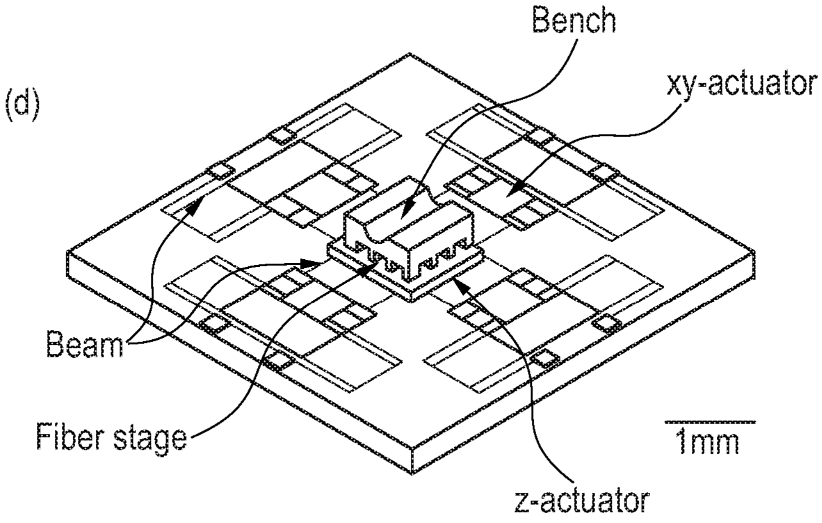
FIG. 2 is an enlarged view of one of the fibre carrier stages of the assembly of FIG. 1.
Figure 3:
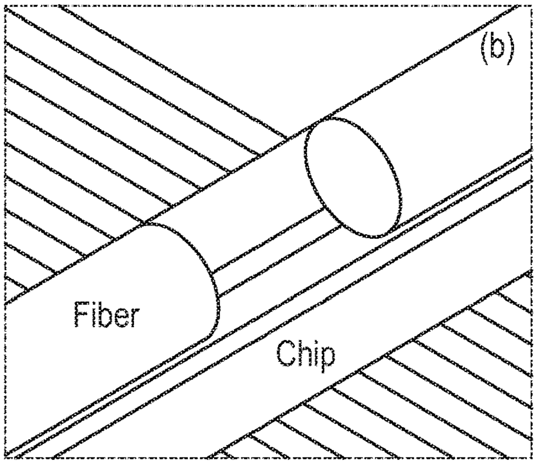
FIG. 3 is an enlarged view of the ion trapping site of the ion trap chip.

An example of a known MEMS-based design of a fibre cavity integrated with an ion trap in shown in FIGS. 1 to 3. The assembly comprises a surface ion trap integrated with a MEMS-based fibre cavity system. The micro-fabricated chip has a linear Paul trap configuration with first and second radiofrequency (RF) rails used to generate a pseudo-potential tube along the y-axis. Axial confinement of ions is achieved by applying voltages to the outer DC electrodes. The axis of the ion string is designed to align with that of the cavity in, such a manner that a plurality of ions can be coupled to the cavity mode. First and second inner DC rails provide the principal axes of the trapping potential, to ensure that the k-vector of the Doppler cooling laser overlaps with all axes. The ion height above the trap surface may be controlled by adding RF voltages to the inner DC electrodes. A slot is disposed between the two inner DC electrodes, which allows for optical access to the ions from underneath the chip. A cavity is formed by two fibre mirrors, each of which is supported by a MEMS-based fibre stage, having actuators that provide 3D position control.

As can be seen in particular in FIG. 1, a support plate with a U or V shaped channel supports the fibres. Each fibre is also held to an actuator element, which generates motion in the xy plane. The fibres can be moved along the z-axis via the electrostatic force between the stage and the underlying fixed plate. Continuous positioning is designed to allow compensation of any misalignment between the fibre mirrors, to align the cavity mode to the ion position and to lock the cavity frequency. The trapping chip and the fibre stages are fixed together by a common base plate having aligned grooves. The fibres and trapping chip are glued individually to the base plate.

It is believed that while such a structure can be made stable, there can be potential misalignment and tension between the components, potentially requiring use of a strain relief component, for example a piezoelectric element, between the fibres and the feedthrough.

The disclosures herein seek to provide an improved optical chip assembly and a method of making an optical chip assembly.

The concept of the preferred embodiment forms alignment features directly into the ion trap chip substrate to position and align microstructures such as spacers and/or an optical module onto the ion trap chip. This is preferably achieved using microfabrication techniques to etch locating features into the surface of the ion trap chip. The method can be carried out with lithographic precision, achieving the high alignment accuracy required for the optical beam geometries, typically to an accuracy of a few micrometres.

In the preferred embodiments, etching is carried out with potassium hydroxide, into the silicon or other material of the chip substrate. In other embodiments, the formation can be micro-machined, although this is not preferred.

In the preferred embodiment, features are etched into a 3D ion microtrap chip, into which an external microstructure such as an optical module can be located.

In the preferred embodiment, the alignment features are etched along defined crystal planes, for example of the silicon substrate of the chip. These alignment recesses can be defined by lithography. Aligning along natural crystal planes provides very high alignment accuracy and repeatability.

An external microstructure can be micro-machined with lithographic precision to contain locating features that will fit, or "plug", into the recesses of the chip, as detailed above.

The external microstructure may be an optical module containing an array of waveguides and micro-lenses. These can be provided and arranged for the purpose of guiding a plurality of laser beams to well-defined spatial positions in the aperture of the ion microtrap chip.

In an embodiment, the external microstructure may be a combination of a spacer (for example micro-machined from silicon) and an optical module disposed on top of the spacer. The purpose of the spacer is to enable the optical module to be located at a well-defined distance and position from the microtrap chip, as dielectrics can perturb the electrodynamic trapping potential created by the microtrap chip.

The same principle of etching and micromachining of lithographically defined features can be used for forming both the spacer and the optical module so that they interlock with each other and to the microtrap chip. This enables accurate positioning of the optical module with respect to the microtrap chip at the relevant positioning accuracy and resolution required.

The preferred embodiments enable the construction of a microtrap with a 3D electrode structure. The optical module can have a multitude of waveguides illuminating multiple positions in the array with multiple wavelengths of laser light. This is a material advantage over a system that provides a single optical cavity mode interacting with a single point in space.

Advantageously, the assembly comprises a plurality of receiving formations in the chip substrate, being coplanar with one another as a result of being in the plane of the chip substrate. This has the advantage of readily being able to align microstructures, such as optical fibres, receivers and mirrors, in a common plane.

The formations in a preferred embodiment provide for locating optical fibres in aligned but spaced relationship, so as to form an optical cavity between two or more optical fibres.

One or more fibres may be formed on a spacer or other element allowing for moving of the optical fibre, typically in and x-y plane and as appropriate in along the z axis.

It will be appreciated that the optical module will contain micro-lenses to focus the light, advantageously to focus the beam to the required small spot size (typically in the range of around 30 μm to around 100 μm, but not exclusively. An un-focused beam may illuminate the ions, but it will also create a lot of background scatter photons that are detrimental to the signal to noise in qubit state measurement procedures. A micro-lens close to the output of the waveguide has the advantages that:

- it will focus the beam to the desired size at the desired distance from the optical module (which would correspond to the centre of the ion microtrap aperture;
- it can direct the beam emerging from the waveguide in a well-defined direction; this allows beams to illuminate the ions from different directions which is experimentally advantageous The preferred method for realising this micro-lens array is with diffractive micro-lens structures.

Figure 4:
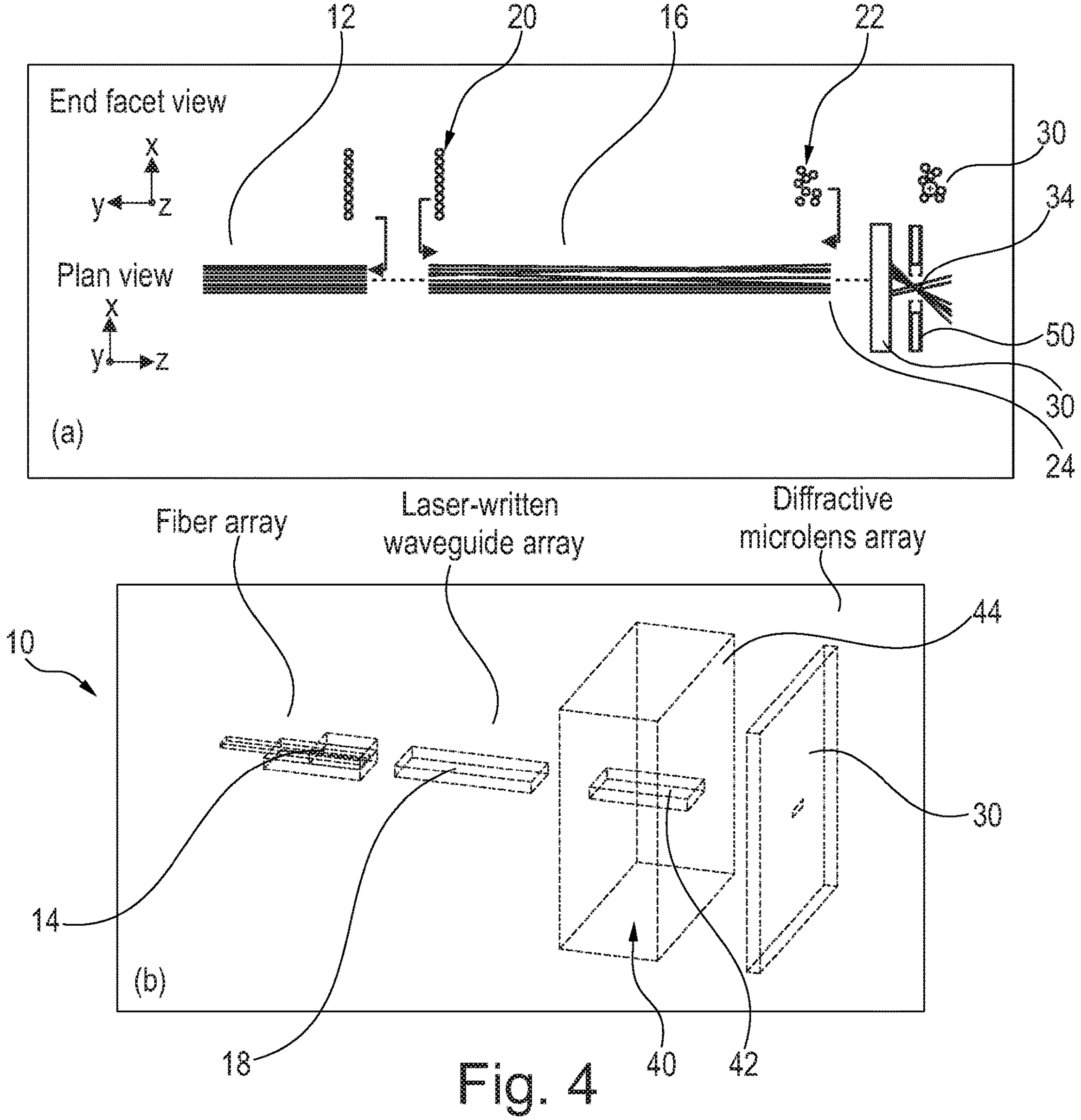
FIG. 4 is an optical path and schematic diagram of an example of an optical module with a multiple beam source for an embodiment of assembly according to the teachings herein.

Referring to FIG. 4, this shows in schematic form an embodiment of optical assembly 10 designed for coupling to an ion trap chip to form an assembly in accordance with the present invention.

The assembly 10 of FIG. 4 comprises a plurality of optical elements, typically optical fibres 12 which, as will become apparent in what follows, are designed to provide an optical module, formed by the fibres, waveguide and microlenses able to illuminate individual zones in the microtrap's array of segmented electrodes. Illuminating each zone means that laser beams of different wavelengths can interact with the ion(s) stored in these zones. This is for the purpose of cooling, qubit initialisation and control, as well as state readout.

At the input side of the optical assembly 10, there is provided a linear array of optical fibres 12 held in a fibre support 14 and which extend to a waveguide array 16 formed in a substrate 18. The waveguide array 16, in this embodiment, redirects the linearly arranged input optical fibres 12 from the input stage to an output stage at the end 24 of the waveguide array 16 at which the fibres 12 are displaced in the X and Y directions, normal to the longitudinal axis of the assembly and optical fibres 12, for purposes that are explained below.

At the output end 24 of the waveguide array 16, there is provided a diffractive micro-lens array 30. The micro-lens array 30 is configured to cause the light beams from the outputs of the optical fibres 12 to converge to focal points 34, which in practice are configured to be at the centre of the aperture of an ion microtrap, described in further detail below. In practice, a subset of the laser beams that emerge from the optical module will converge and overlap at a specific point in space. That point in space corresponds to a specific zone of the ion microtrap array. This subset of laser beams will then illuminate ions stored in that zone of the microtrap. The module will contain more than one set of such beams, for the purpose of illuminating other zones in the microtrap array.

For support and stability purposes, the waveguide array 16 is disposed within a support block 40 having a bore 42 extending therethrough having a transverse cross-sectional shape substantially matching the transverse cross-sectional shape of the waveguide array substrate 18. In this embodiment, the waveguide support block 40 has a front surface 44 which is substantially flat (planar), consistent with the planar rear surface of the micro-lens unit 30. This ensures accurate optical orientation of the waveguide array 16 relative to the micro-lens array 30, that is orthogonal thereto. It will be apparent that the front face 44 of the support block 40 may be of any other shape or structure suitable to ensure accurate alignment and orientation to the micro-lens array 30.

Figure 5:
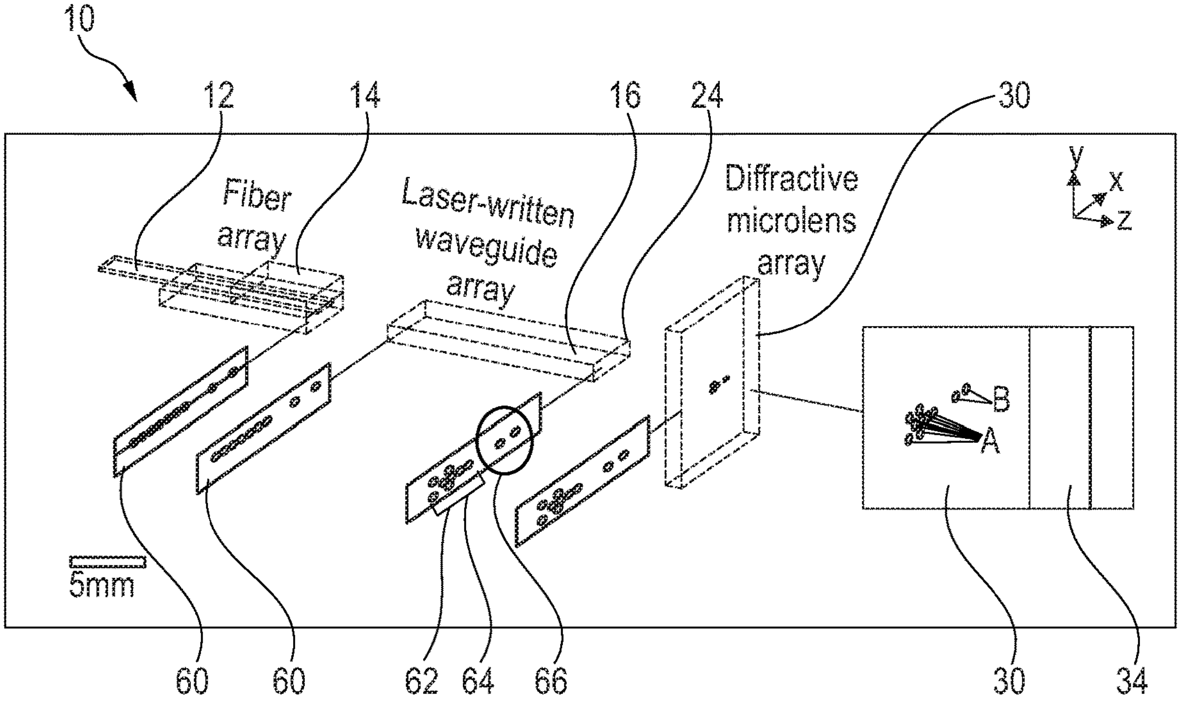
FIG. 5 is a schematic diagram of the optical elements for the arrangement of FIG. 4.

With reference now to FIG. 5, this shows the elements of the optical assembly 10, shown alongside sectional views depicting the arrangements of the optical fibres 12 along the length of the assembly 10. The waveguide support unit 40 is not shown in FIG. 5.

The optical fibres 12 may extend along the entirety of the stages 14, 16, although in other embodiments the fibres may be in individual sections, each extending along a respective stage 14, 16 of the assembly 10 and optically coupled at their ends in a manner known in the art.

At the input stage 14, the array of optical fibres 12 is maintained in a linear configuration, longitudinally within the input stage 14 and also in a linear array relative to one another, as depicted at the output 60

Within the waveguide array 16, the fibre paths diverge in the xy planes to create a predetermined first pattern of optical outputs in a first zone 64 of the output 62 at the end 24 of the waveguide array 16, and a second group of optical outputs in a second zone 66 laterally displaced from the first group 64. In practice, these two groups of optical outputs provide two different sets of light beams. The micro-lens array 30 is configured to cause the two sets of light beams form the two clusters 64, 66 to converge towards one another at point 34. The beams will overlap at the same point in space, in order to illuminate the trapped ions. Different wavelengths are used for the different tasks, such as cooling and state readout, and qubit state initialisation and control, as well as other tasks.

Figure 6:
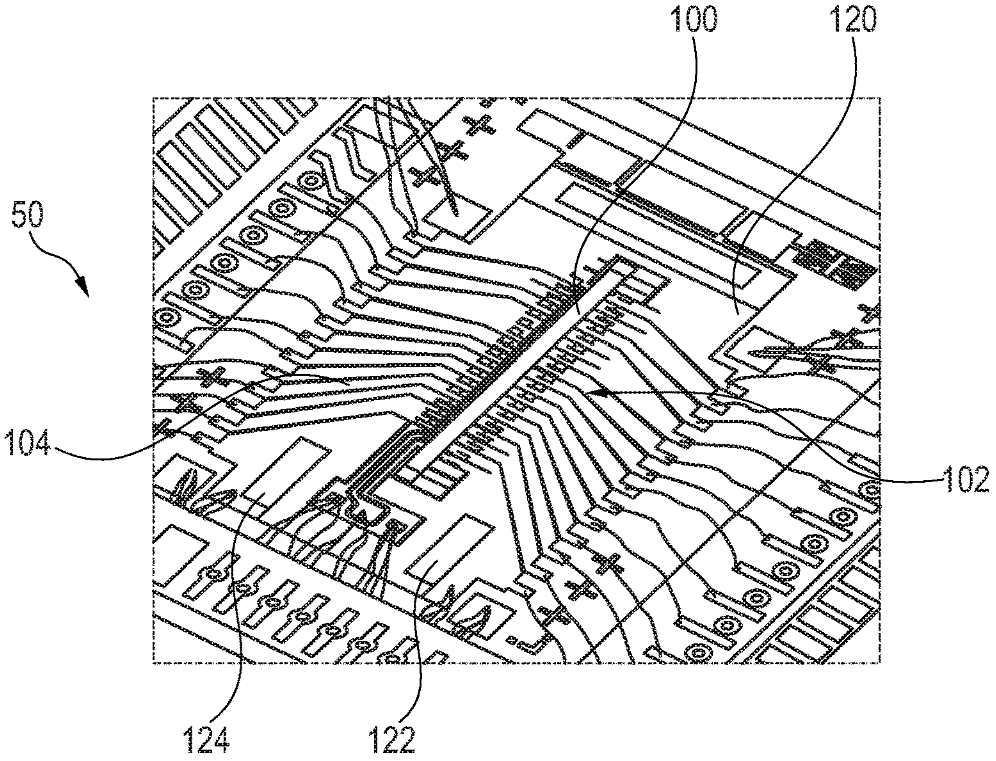
FIG. 6 is a perspective view of the major part of an example of ion microtrap chip to which the teachings herein can be incorporated.

Referring now to FIG. 6, this shows an embodiment of ion microtrap chip 50 to which the optical module assembly 10 is configured to couple so as to direct the light beams from the micro-lens array 30 into the ion trap 100 located, in this example, at the centre of the chip 50. The chip 50 is fabricated according to known techniques and includes a plurality of electrical terminals 102, 104 disposed in series along the length of the ion trap slot 100, in known form.

Referring back to FIG. 4, it can be seen that the point of overlap 34 of the light beams from the optical fibres 12 is arranged to be disposed within the ion trap slot 100, for which it is necessary accurately to align and orient the optical assembly 10 relative to the ion trap chip 50 and in particular the ion trap slot 100.

In accordance with the teachings herein, in addition to forming the ion trap chamber 100 in the chip 50 and providing the electrical terminals 102, 104 and other standard components of the ion trap chip, there are formed within the substrate of the ion trap chip, typically made of silicon, a series of alignment features that can couple directly to a micro-structure, such as but not limited to an optical assembly of the type shown in FIGS. 4 and 5.

It is preferred that the alignment features (not shown in FIG. 6) are disposed on surfaces of the microtrap chip 50 that are otherwise free of other electronic components or uses. It is also preferred that the alignment features are spaced from one another and comprise, at least in some embodiments, characteristics generating lateral (that is in the plane of the chip surface) orientation, at least individually and/or in combination with one another. In the example shown in FIG. 6, there may be provided three alignment features at locations 120, 122 and 124 on the chip. As can be seen in FIG. 6, these three alignment locations 120-124 are in this example disposed at opposing ends of the ion trap chamber 100, with the alignment location 120 being elongate and extending substantially perpendicularly to the ion trap chamber 100, while the alignment locations 122 and 124, also of elongate form, are disposed in the same longitudinal direction as the ion trap chamber 100 but spaced therefrom in a lateral direction and extending either side of the chamber 100. In this particular configuration, the alignment locations 120-124 are disposed in what could be described as a triangulated arrangement around the ion trap chamber 100, which in combination can provide locations for accurate alignment and positioning of a microstructure onto the chip 50, such as an optical assembly 10 of the type shown in FIGS. 4 and 5.

In this embodiment, each of the alignment locations 120-124, being elongate, also enables both positioning and orientation of a component coupled thereto own.

Figure 7:
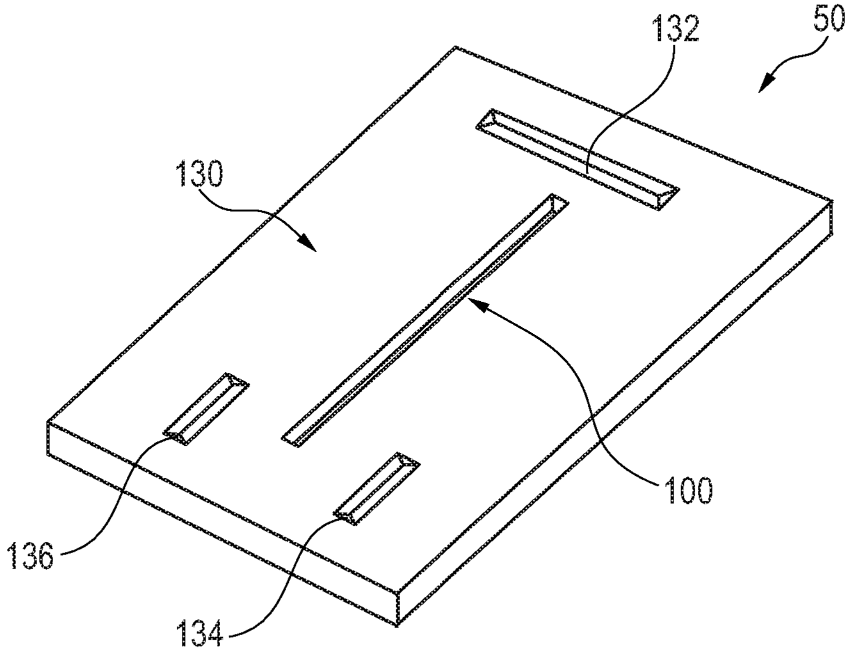
FIG. 7 is a schematic diagram showing an example of etched alignment recesses in a chip substrate.

Referring now to FIG. 7, this shows in schematic form the major features of one embodiment substrate 130 of the microtrap chip 50 having alignment characteristics similar to those described above in connection with FIG. 6.

The alignment features disposed at the locations 120-124 are in this embodiment etched channels 132-136. These can be formed by etching with, for example, potassium hydroxide using suitable etch masks over the portions of the chip or substrate to be protected. The process of etching with potassium hydroxide will create pyramidal recesses or channels at each location 120-124, forming the alignment features of the structure. The channels or recesses 132-136 can receive corresponding protrusions or ribs on the abutting surface of a microstructure to be disposed on and fitted to the chip 50. Such protrusions or ribs could be micro-machined onto the abutting surface by micro-machining or any suitable etching process.

In some embodiments, the recesses 120-124 in FIG. 6 may not be pyramidal in form, as the FIG. 7 recesses 132-136 are. The recesses in FIG. 6 may be made by etching silicon dioxide from the wafer to reveal the silicon material underneath. These are preferably 15 micrometres deep (the thickness of SiO2 layer). Such recesses could be used for alignment and positioning, although not as precise as the pyramidal recesses of FIG. 7. The recesses of FIG. 6 can nevertheless be successful for positioning purposes.

In the preferred embodiments, etching for interlocking is done with a wet etch of silicon in potassium hydroxide, which is a well-known process. Choosing the crystal orientation of the substrate appropriately allows etching along crystal planes in the silicon. This allows the etching of recesses into the ion microtrap chip with well-defined wall angles in the recesses. Careful calculation of the photolithography mask ensures the desired shape and depth of the recess. Experimentation to calibrate the etch rates on the material is a matter well within the ability of the skilled person.

Each alignment feature 132-136 may in practice receive an elongate mating element or elongate series of mating elements formed on the microstructure to be located on and relative to the microtrap chip 50.

As will be apparent in FIGS. 6 and 7, in addition to being elongate in form, the alignment elements 132, 134 are also disposed orthogonally to the alignment element 132, which enables the three elements 132-136 to provide a very accurate positioning and orientation of a microstructure on the chip 50.

It is preferred that a plurality of alignment features 132-136 is provided, although in some embodiments a single alignment feature may be used. It is also contemplated that just two alignment features 132-136 may be provided, advantageously disposed orthogonally to one another. A variety of arrangements and forms of alignment features may be provided on the surface of the chip substrate and the eventual arrangement will largely depend, as the skilled person will appreciate, upon the structure of the chip, the nature and location of free areas which can support alignment features and also any wire bonds that are necessary between the ion trap terminals and the input/output at the edges of the chip 50; as well as the nature and shape of the micro-structure to be coupled to the chip.

It is preferred that the recesses or channels of the alignment features 132-136 are formed along defined crystal planes of the substrate 130. Not only does this produce a very reliable etched formation within the substrate 30 but it also provides a very accurate alignment characteristic based upon the crystal planes of the substrate 130. In this regard, it is preferred that the substrate 130 is formed such that the natural crystal planes of the substrate material align with the intended orientations of the alignment elements 132-136 to be formed in the surface of the substrate, or at least with one or more of these.

The alignment elements 132-134 preferably have a depth of around 20 to 50 micrometres, up to a maximum of 100 micrometres. Depths of this nature will not impact on the integrity of the chip, which will typically have a depth of around 350 micrometres.

Use of potassium hydroxide naturally generates a V-shaped groove or channel when used as an etch medium on silicon. Grooves or channels of this nature are considered optimal for achieving very accurate positioning and orientation of a micro-structure onto the chip 50.

By having the alignment elements 132-136 formed directly on the chip substrate it is possible to do away with any intermediate coupling device, which complicates assembly and leads to alignment inaccuracies. By contrast, it is possible to achieve very precise orientation and positioning of the micro-structure relative to the chip.

Figure 8:
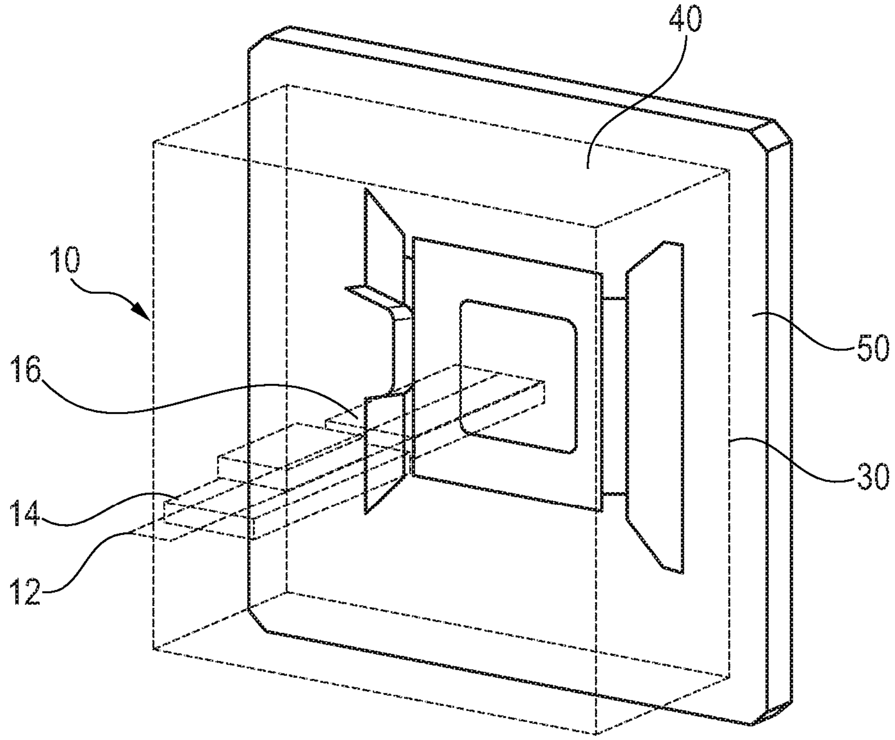
FIG. 8 is a schematic diagram of an embodiment of ion trap chip assembly where the optical components are fitted onto an ion trap chip.

Referring now to FIG. 8, this shows the optical assembly 10 of FIGS. 4 and 5 fitted to the ion microtrap chip 50, with the diffractive micro-lens array 30 is disposed directly on the substrate 50 (that is with no interposing component), for which purpose the front surface of the diffractive micro-lens array 30 is provided with protrusions or ribs that ideally substantially match the shape of the grooves or channels of the alignment features 132-136 of the microtrap chip 50. This enables very precise positioning and orientation of the optical beams relative to the ion trap chamber 100.

In principle the arrangement of FIG. 8 would locate the optical module with respect to the microtrap chip. However, in practice, it is likely to be desirable for this module to be a little bit further away, with the substrate surface containing the microlenses spaced approximately 2 mm from the microtrap chip. This can be achieved with an interposer to locate into the microtrap chip, and the optical module to locate into the interposer.

The lower side of the interposer will locate into the ion microtrap chip, and the upper side will accommodate the optical module. The interposer is preferably made of silicon wafer material that is approximately 2 mm thick. The interposer chip can also be made of silicon. Choosing the crystal orientation of this wafer material appropriately will mean that on the interposer lower side, the material can be etched to leave protrusions with angles to match the recesses in the ion microtrap chip. Thus the interposer protrusions can be located with high accuracy into the recesses of the microtrap chip. These recesses and protrusions could be pyramidal in form or truncated pyramidal.

On the upper side, the means to locate the optical module with respect to the interposer could, instead of by the same process, in some embodiments be achieved by creating a deep etch into the silicon (deep reactive ion etch) which has straight sidewalls.

Figure 9:
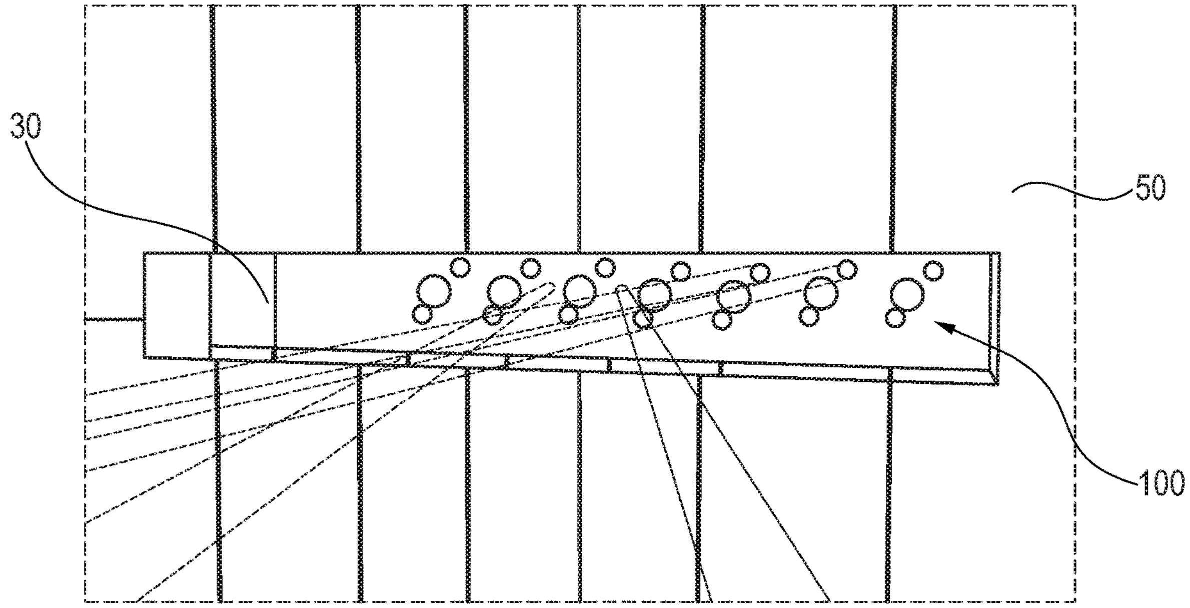
FIG. 9 is a view of the assembly of FIG. 8 from the reverse side showing the passage of the plurality of light beams through the ion microtrap zone.

FIG. 9 shows a view form the other side of the assembly of FIG. 8, in which can be seen that the light beams emanating from the diffractive-lens array 30 will pass through the ion trap chamber 100 at very accurate positions at the point at which they interfere with one another.

Figure 10:
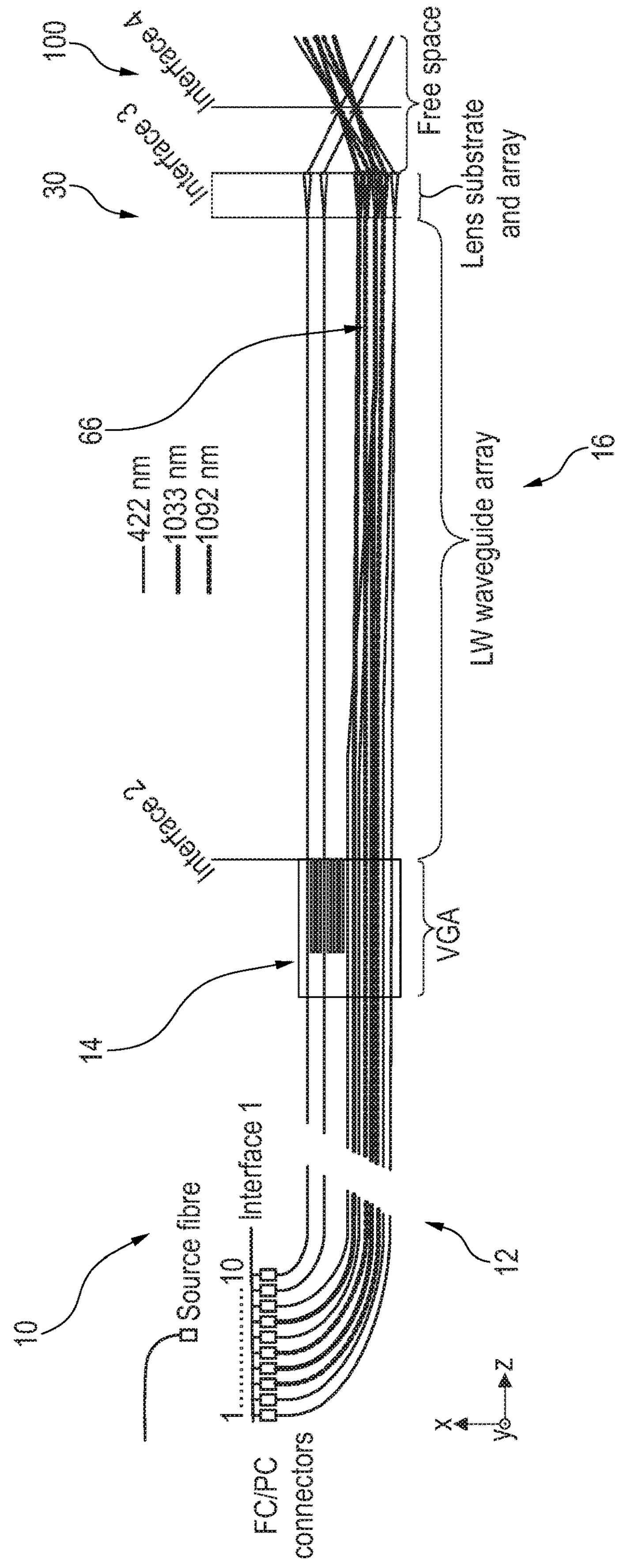
FIG. 10 is a schematic diagram showing further characteristics of the optical module of the assembly.

Referring now to FIG. 10, this is a schematic diagram of a preferred embodiment of the optical assembly 10 of FIG. 4 when used in an ion trap chip as shown in FIGS. 8 and 9. As will be apparent from FIG. 10, the embodiment shown comprises 10 fibres leading to 10 waveguides, and so 10 output beams. These are grouped in two sets of 5 beams each. Each set of 5 beams has three at 422 nm, one at 1033 nm and one at 1092 nm. All five beams in the set overlap at one unique point in space. The second set of 5 beams overlaps at a separate unique point in space. It is to be appreciated that the precise wavelengths are not important, but relevant wavelengths generally will range from UV or deep blue through to 1 micrometre range. The exact wavelengths required is dependent on the atomic species used.

The optical assembly 10 has four effective optical interfaces, interface 1 being at the input or source, interface 2 being at the junction between the linear fibre array support 14 and the waveguide array 16, interface 3 being at the lens substrate 30 and interface 4, being in free space, and occurring within the ion microtrap 100. It is at interface 4 that the beams of the light from the optical fibres 12 cross and interfere.

Figure 11:
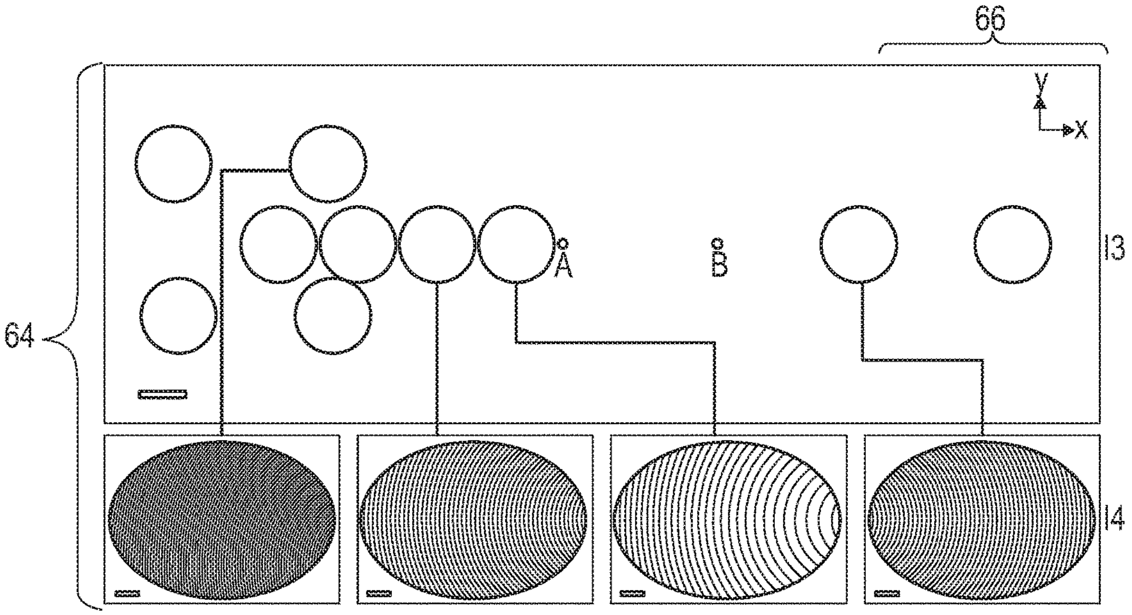
FIG. 11 shows in the top image an optical microscope image of the microlens array and in the bottom image a series of scanning electron microscope images of the different microlenses in the array.
Figure 12:
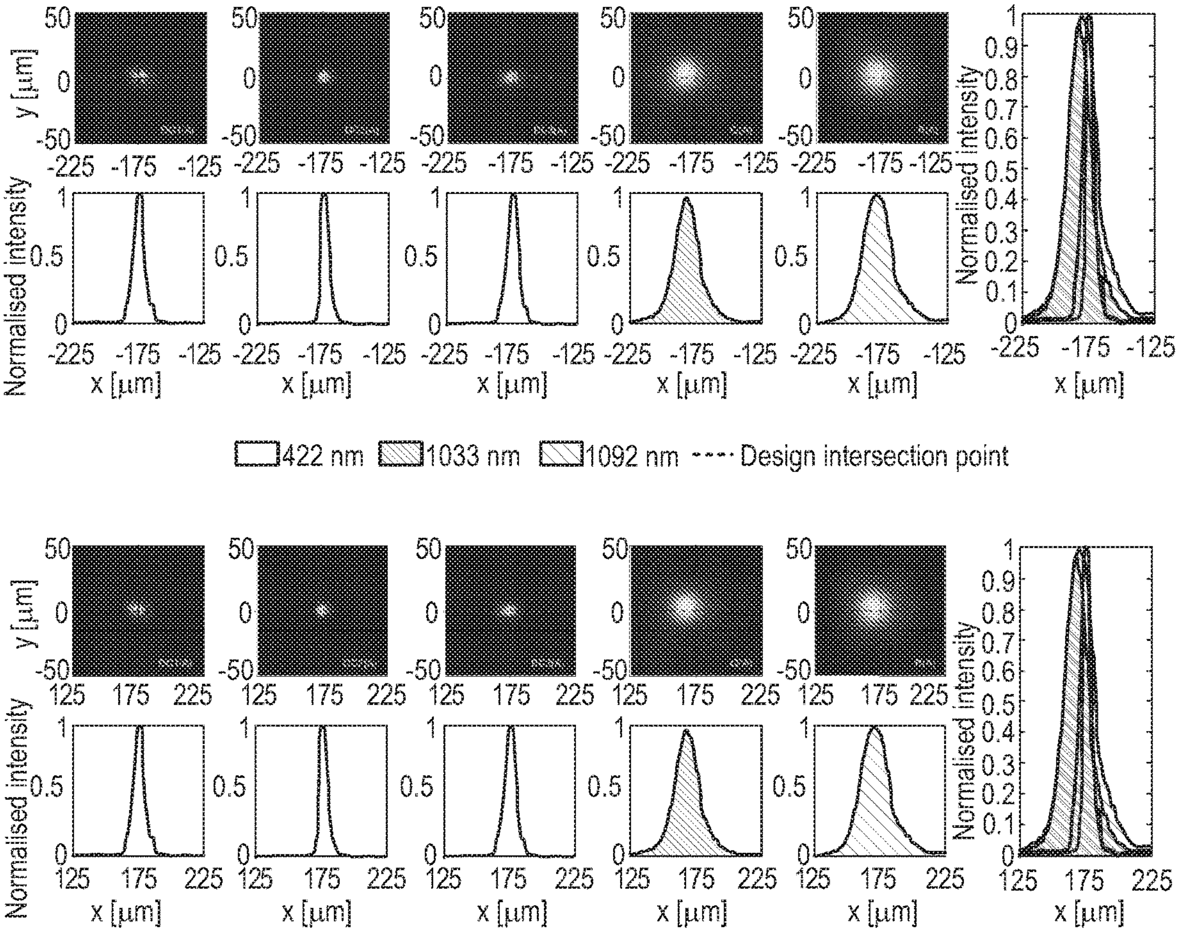
FIG. 12 is a series of graphs of beam intensity caused by beam overlap produced by the optical module of the assembly.

Referring now to FIGS. 11 and 12, the light beams at interface 3 (identified as I3 in FIG. 11) produce at interface 4 (identified as I4 in FIG. 11) interference patterns of which four examples are shown in the lower half of FIG. 11. FIG. 12 shows the light beam intensity values at the intersection points of the various light beams of the example of FIGS. 10 and 11.

It will be appreciated that this structure provides a trap for the ions created by the electrodynamic potential arising from the voltages applied to the electrodes of the microtrap chip. The laser beams provide for cooling the ions, controlling their quantum state and for reading out the quantum state. The combined structure of the optical module and the ion microtrap provide the means to illuminate individual zones in the microtrap array with laser beams for the aforementioned purposes.

A practical embodiment of a preferred method of forming the positioning and alignment features is shown in FIGS. 13 to 18.

Figure 13:
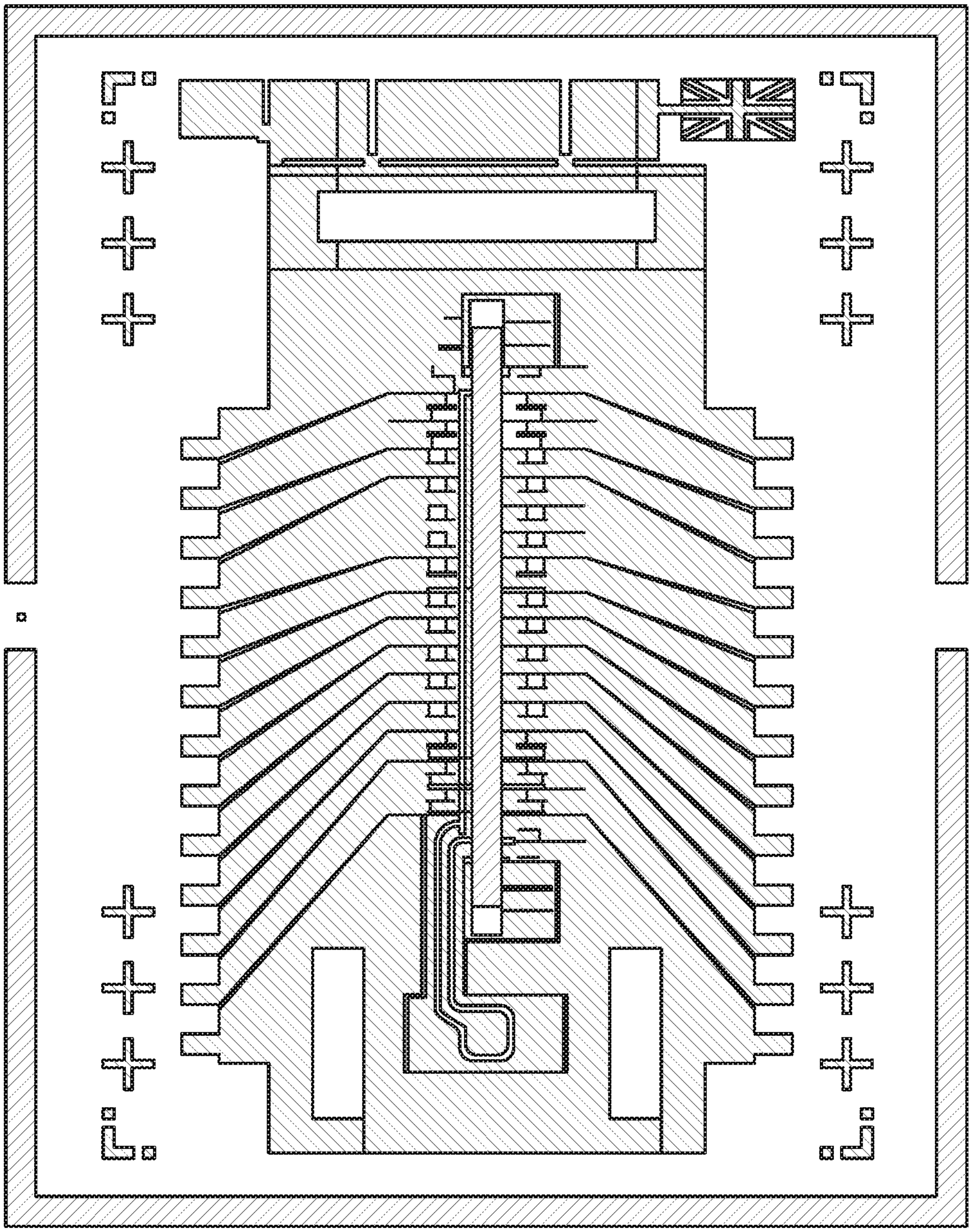
FIG. 13 is a schematic diagram showing an on-chip spacer and optical mount with integrated atom shield for use in forming the positioning elements in an ion trap chip.

Referring to FIG. 13 first, the microtrap chip (the device chip) has three rectangular recesses (indicated by the 3 red outlined rectangles shown to the right) that have been dry etched via Deep Reactive Ion Etching (DRIE) into the 15-micrometre thick oxide layer, as indicated by the rectangles outlined in red in the diagram. These recesses are openings to the underlying Silicon (Si) substrate.

The rectangular recesses in the 15 micrometre thick oxide layer can act as passive locating features to receive protruding features in structures to be stacked onto the chip.

The rectangular recesses can also act as a 'mask' to anisotropic wet chemical etching of the underlying Si substrate to create atomically defined trenches that can extend the locating options of the device chip with mounted structures such as an optical interface.

The silicon substrate in question is preferably of <100> type, meaning V-profiled trenches, defined by <111> atomic planes, can be etched into the substrate that can mate with protruding V-profiled features in structures that are stacked onto the device chip.

Figure 14:
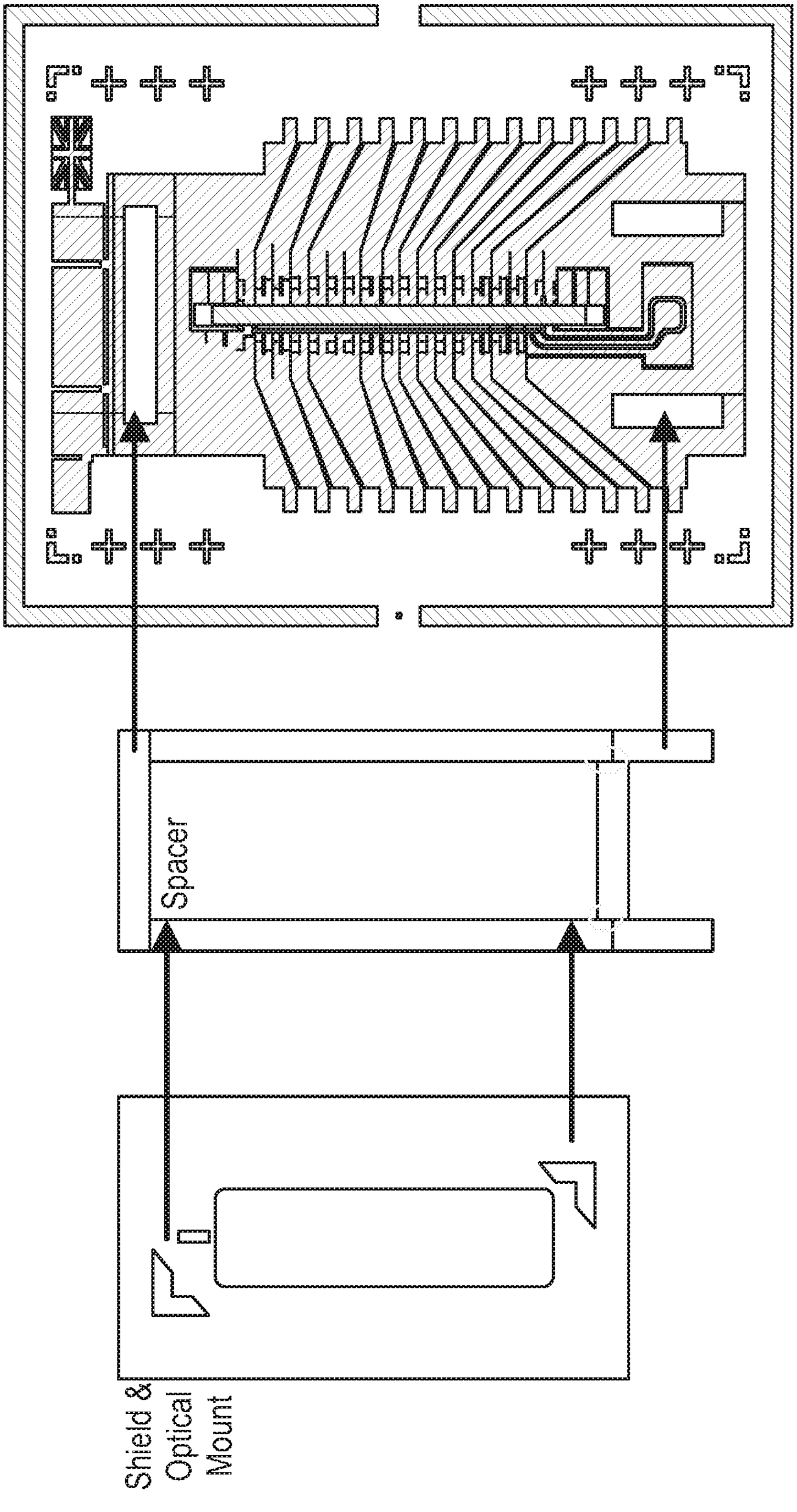
FIG. 14 is a schematic diagram of an embodiment of components for an assembly of multi-chip module (MCM)
Figure 15:
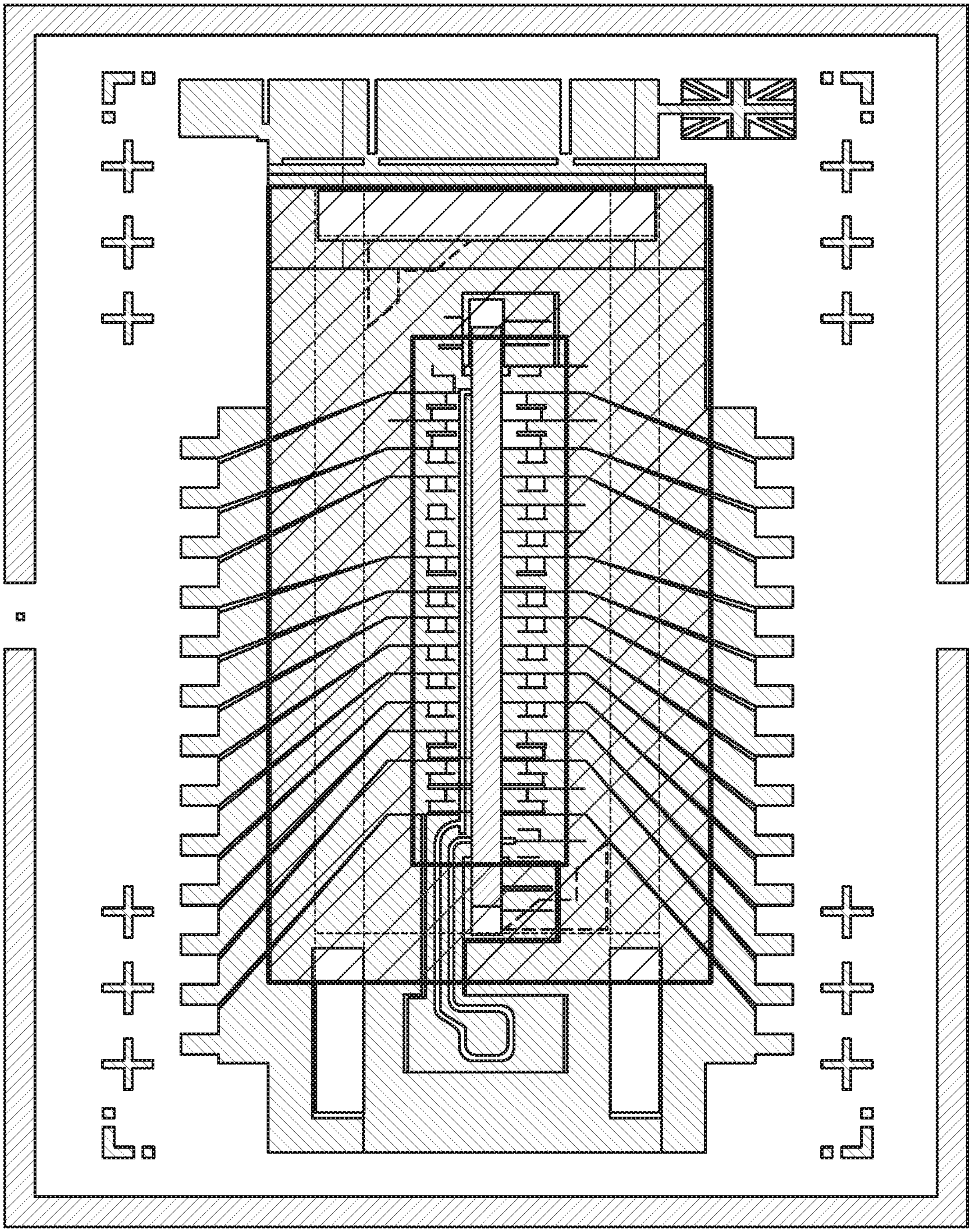
FIG. 15 shows the assembly of FIG. 14 with the components in position.

FIGS. 14 and 15 show one approach to stacking an A-frame 'spacer' structure formed by DRIE of a bonded silicon on insulator (BSOI) wafer.

Figure 16:
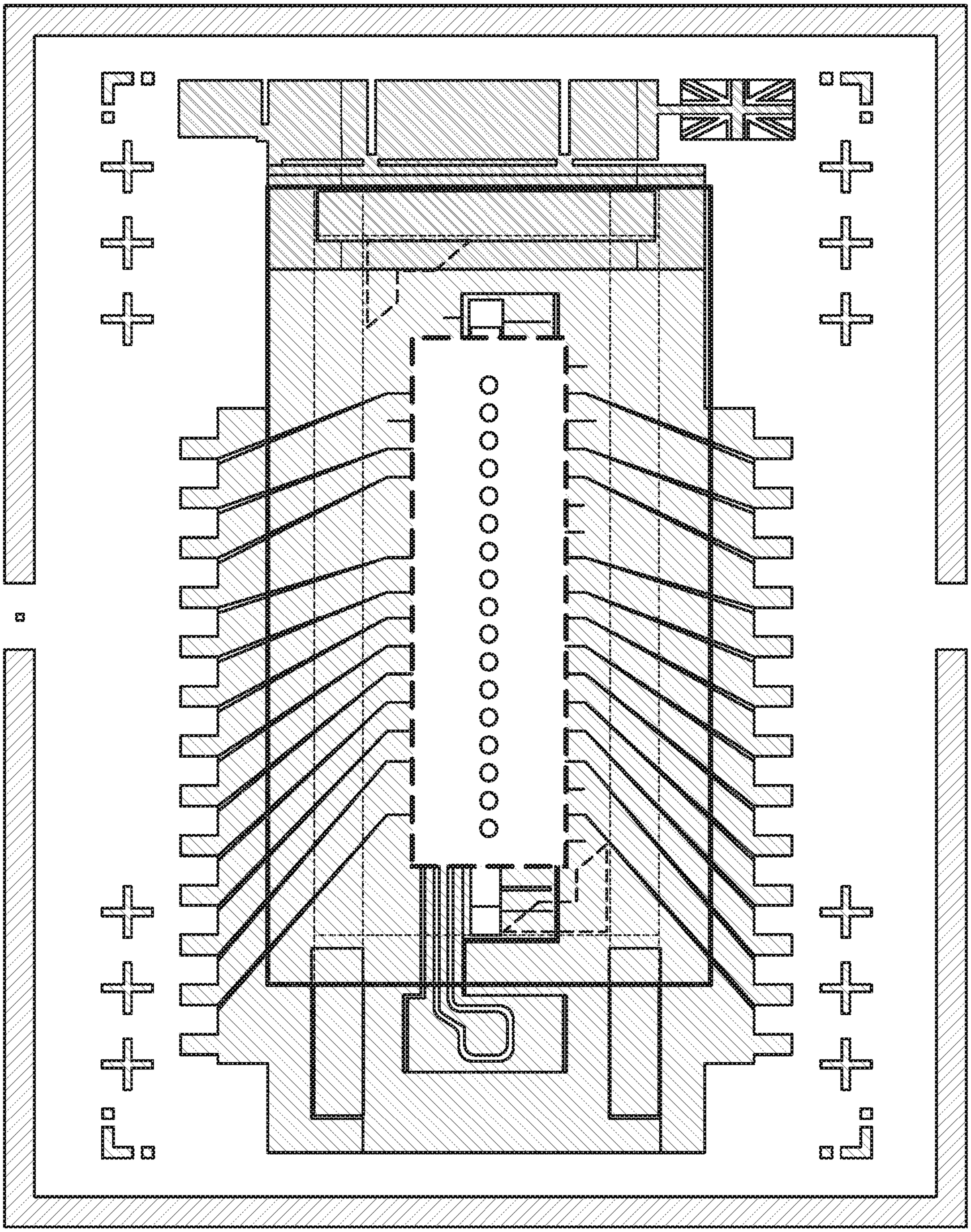
FIG. 16 shows the assembly of FIG. 15 with an embodiment of lens array positioned into the integrated shield aperture of the assembly.

Referring now to FIG. 16, the purposes of the spacer and optical mount structures are: i) to achieve sufficient vertical separation between the optical lens and fibre module to minimise lossy coupling with the RF fields of the device chip and ii) to employ conventional silicon micromachining techniques to create a multi-chip module (MCM).

The aperture in the optical mount is vertical in the embodiment shown above, but it is also possible to employ the same anisotropic wet chemical etching techniques as mentioned earlier to form a V-profiled opening that mates with mirror protruding features in the optical lens array and fibre module.

The mount shown in FIG. 14 can be used alone in combination with the microtrap chip as an atom shield. It is to be understood that the teachings herein are not limited to optical assemblies.

There is often a need to shield the metallic surfaces of the electrode structure from the beam of atomic vapour used to create the ions that are loaded into the trap. This is done using a structure such as the mount of FIG. 14 disposed above the surface of the microtrap chip, for which the key features are:

(i) the shield has a small aperture which enables the atoms in the vapour to pass through and be loaded into the trap, (ii) it has sufficient extent otherwise which blocks atoms and stops them from hitting the electrode structure of the ion microtrap device, (iii) the shield aperture is typically about 200 μm×600 μm (the exact dimension will be determined by the design of the trap chip and the dimensions of aperture and electrodes in that microtrap structure);

(iv) the shield aperture is well aligned to the aperture in the trap chip to enable the atoms to hit the trap loading zone and to prevent the atoms hitting the electrodes.

In the prior art, this feature is achieved using a hand-assembled structure and aligned by hand and mounted onto the chip carrier rather than the microtrap chip itself.

A micro-structured shield containing an aperture and self-alignment features as taught herein can achieve better positional accuracy and repeatability. Thus the self-alignment principle of the optical module with respect to the chip can be similarly applied to a standalone atom shield. This is also illustrated in FIGS. 9 and 10.

All microtrap chips can benefit from an atom shield to mask the electrodes from atomic vapour. This is true for all existing devices in order that they can operate reliably over months and years from the start of use.

In an embodiment, a micromachined structure incorporates an atom shield with self-alignment features as taught herein so that the structure can be stacked on top of the ion microtrap chip itself. Silicon is used as the material for the atom shield for its ease of micromachining. Once machined, the shield is metallised so that it can be grounded in the device (floating electric potentials of surfaces in proximity to the ion trap distort the electrodynamic potential of the device in a detrimental way). The teachings herein therefore also encompass a micro-structured shield (with an aperture) self-aligned to the microtrap chip, without an optical module.

The atom shield aperture would typically sit about 2 mm above the surface of the microtrap chip. The optical module would preferably be around 4 mm above the surface of the microtrap chip. The microtrap chip is a dielectric surface which cannot be metallised entirely, and such a distance prevents distortion of the electrodynamic potential created by the microtrap chip. An optical module on its own (i.e. in the absence of any atom shield) therefore advantageously includes a spacer between it and the trap chip.

It is envisaged that a single micro-structured component, or more than one micro-structured component, could combine the purpose of atom shield with that of a spacer to enable the optical module to be accommodated, all in a single stack with self-aligning features.

Figure 17:
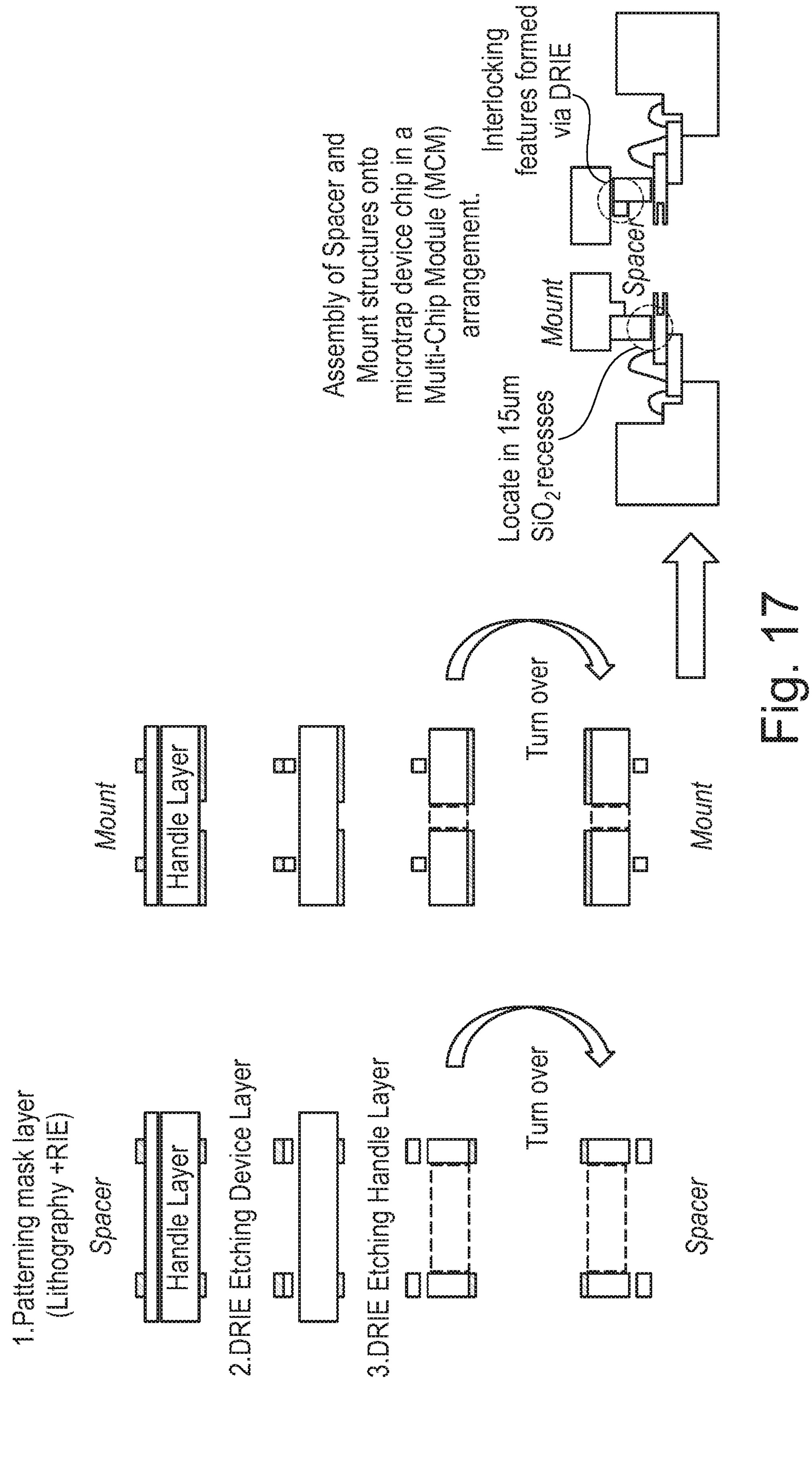
FIG. 17 shows an embodiment of process flow, based on DRIE only, for forming a microtrap chip mounted optical module with integrated atom shield.
Figure 18:
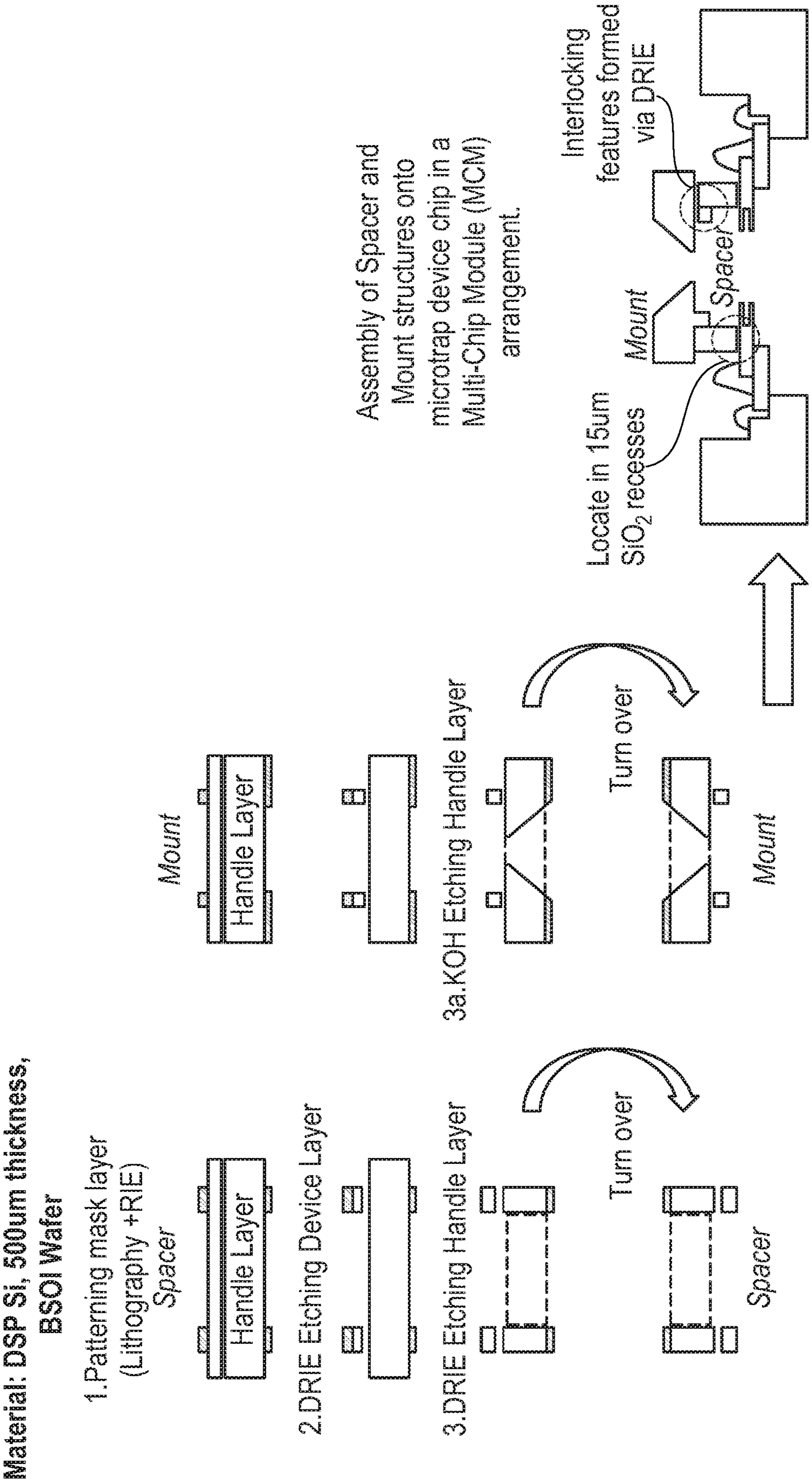
FIG. 18 shows an embodiment of process flow, based on a combination of DRIE and anisotropic wet etching in KOH (optical mount), for forming a microtrap chip mounted optical module with integrated atom shield.

FIGS. 17 and 18 show two examples of process steps for the spacer and optical mount using: i) a DRIE process to form both, and ii) a combination of DRIE and anisotropic wet chemical etching are shown.

Figure 19:
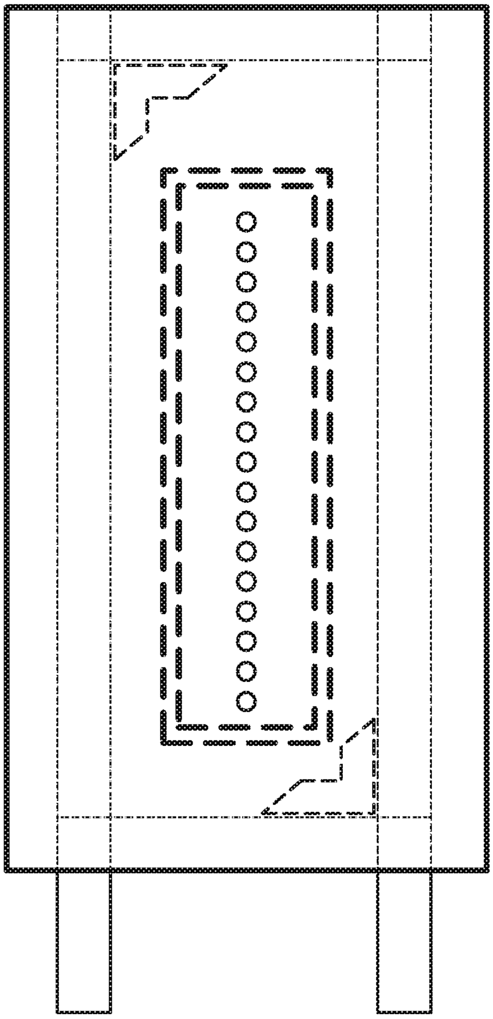
FIG. 19 is a schematic diagram of an assembly for another embodiment of manufacturing process.

FIG. 19 shows another embodiment, in which passive silicon alignment mechanisms can be dry etched (via DRIE) into the optical mount to fix and secure precisely the x-, y- and z-position of the lens and fibre optical module to be mated onto the MCM microtrap device chip.

Should they be desired, compliant cantilever spring or clip structures might be formed in the optical mount via DRIE and, together with means of avoiding stubbing when mating with the optical lens and fibre module, can provide an integrated latching, locking and alignment mechanism to allow optical modules of varying dimensions and characteristics to be 'plugged-in' to the optical mount, and with the option of removing and replacement.

Such latching or locking mechanism could be active, allowing a so-called zero-insertion force (ZIF) plugging action to mount optical modules onto the optical mount on the MCM chip. Such active elements could be actuated by microelectromechanical systems (MEMS) thermal, piezo or electrostatic actuators, or a combination of these.

It is not currently envisaged that the preferred embodiments would use such latching or locking mechanisms.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

The disclosures in United Kingdom patent application number 2017243.3, from which this application claims priority, and in the abstract accompanying this application are incorporated herein by reference.

What is claimed is:

1. A method of fabricating an ion microtrap chip assembly, including a 3D ion microtrap chip having a chip substrate, and one or more micro-structures disposed on the chip substrate, the method including:

forming one or more first alignment elements directly into the chip substrate;

forming one or more second alignment elements in a given micro-structure of the one or more micro-structures, wherein the first and second alignment elements are one of recesses and protrusions and locating the given micro-structure on the chip substrate with at least one second alignment element keyed to at least one of the first alignment elements; and affixing the given micro-structure in position relative to the chip substrate of the 3D ion microtrap chip whereby the first and second alignment elements are keyed to fix the given micro-structure to the chip substrate in all directions in a plane of the given micro-structure.

2. The method according to claim 1, wherein at least one resource recess is etched into at least one of the chip substrate and/or the given micro-structure.

3. The method according to claim 1, wherein at least one of the protrusions is located directly on at least one of the chip substrate and the given micro-structure.

4. The method according to claim 1, comprising the step of locating a spacer element in the at least one of the first alignment elements and locating the given micro-structure on the spacer element.

5. The method according to claim 4, including forming at least one alignment element in the chip substrate and forming at least two alignment elements in the spacer element, wherein at least one spacer alignment element is disposed in engagement with the at least one alignment element in the chip substrate and another spacer alignment element is disposed in engagement with at least one second alignment element of the given micro-structure.

6. The method according to claim 1, wherein the one or more first alignment elements and the one or more second alignment elements are made of rigid material, and the chip substrate and the given micro-structure are made of rigid material.

7. The method according to claim 1, wherein at least one alignment element is lithographically formed.

8. The method according to claim 1, wherein the given micro-structure is an optical module or an atomic shield.

9. The method according to claim 1, including forming a plurality of recesses for holding a plurality of protrusions, wherein the given micro-structure being an optical module containing an array of waveguides and micro-lenses.

10. A method of fabricating an ion microtrap chip assembly, including an ion microtrap chip having a chip substrate, and one or more micro-structures disposed on the chip substrate, the method including:

forming one or more first alignment elements directly into the chip substrate;

forming one or more second alignment elements in a given micro-structure of the one or more micro-structures, wherein the first and second alignment elements are one of recesses and protrusions and locating the given micro-structure on the chip substrate with at least one second alignment element keyed to at least one of the first alignment elements;

affixing the given micro-structure in position relative to the chip substrate whereby the first and second alignment elements are keyed to fix the given micro-structure to the chip substrate in all directions in a plane of the given micro-structure; and wherein the chip substrate is crystalline, and wherein the at least one of the one or more first alignment elements is formed along a crystal plane of the chip substrate.

11. An ion microtrap chip assembly comprising:

a 3D ion microtrap chip with a chip substrate;

one or more first alignment elements formed directly on the chip substrate;

one or more micro-structures having one or more second alignment elements formed directly on a given micro-structure of the one or more micro-structures;

wherein the one or more first alignment elements and one or more second alignment elements are recesses or protrusions; and wherein the given micro-structure being disposed on the chip substrate with at least one first alignment element keyed to at least one second alignment element, whereby the first and second alignment elements are keyed to fix the given micro-structure to the chip substrate of the 3D ion microtrap chip in all directions in a plane of the ion microtrap chip assembly and thereby to affix in alignment the micro-structure to the ion microtrap chip assembly.

12. The ion microtrap chip assembly according to claim 11, wherein at least one recess is an etched formation in at least one of the chip substrate and micro-structure.

13. The ion microtrap chip assembly according to claim 11, wherein the alignment elements are made of rigid material, and the chip substrate and the given micro-structure and the given micro-structure are made of rigid material.

14. The ion microtrap chip assembly according to claim 11, wherein at least one protrusion is formed directly on at least one of the chip substrate and micro-structure.

15. The ion microtrap chip assembly according to claim 11, including at least one spacer element located on the chip substrate, the given micro-structure being affixed to the at least one spacer element.

16. The ion microtrap chip assembly according to claim 15, including at least one alignment element in the chip substrate and at least two alignment elements in the spacer element, wherein at least one spacer alignment element is disposed in engagement with the at least one alignment element in the chip substrate and another spacer alignment element is disposed in engagement with at least one second alignment element of the one or more micro-structures.

17. The ion microtrap chip assembly according to claim 11, wherein the chip substrate is crystalline, and wherein the at least one of the one or more first alignment elements is disposed along a crystal plane of the chip substrate.

18. The ion microtrap chip assembly according to claim 11, wherein the chip substrate is made of silicon.

19. The ion microtrap chip assembly according to claim 11, wherein at least one micro-structure is one of an optical module and an atomic shield.

20. The ion microtrap chip assembly according to claim 11, including a plurality of first alignment elements holding a plurality of second alignment elements formed on an optical module containing an array of waveguides and micro-lenses, the optical module being the given micro-structure.

* * * * *